(12) United States Patent
Min et al.

(10) Patent No.: US 10,069,462 B1
(45) Date of Patent: Sep. 4, 2018

(54) MULTIPLE-STAGE RF AMPLIFIER DEVICES

(71) Applicant: NXP USA, Inc., Austin, TX (US)

(72) Inventors: Seungkee Min, Tempe, AZ (US); Margaret A. Szymanowski, Chandler, AZ (US); Henry Andre Christange, Egmating (DE)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/443,516

(22) Filed: Feb. 27, 2017

(51) Int. Cl.
| | |
|---|---|
| *H03F 1/02* | (2006.01) |
| *H03F 1/56* | (2006.01) |
| *H03F 3/195* | (2006.01) |
| *H03F 3/213* | (2006.01) |
| *H01L 23/66* | (2006.01) |

(52) U.S. Cl.
CPC ........... *H03F 1/0288* (2013.01); *H01L 23/66* (2013.01); *H03F 1/56* (2013.01); *H03F 3/195* (2013.01); *H03F 3/213* (2013.01); *H01L 2223/6611* (2013.01); *H01L 2223/6655* (2013.01); *H03F 2200/222* (2013.01); *H03F 2200/318* (2013.01); *H03F 2200/411* (2013.01); *H03F 2200/451* (2013.01)

(58) Field of Classification Search
USPC .......................... 330/307, 310, 302, 133, 98
See application file for complete search history.

(56) References Cited

U.S. PATENT DOCUMENTS

| | | | | |
|---|---|---|---|---|
| 6,162,697 | A | * | 12/2000 | Singh ................ H01L 22/00 257/E21.521 |
| 8,659,359 | B2 | | 2/2014 | Ladhani et al. |
| 2008/0231373 | A1 | | 9/2008 | Rahman et al. |
| 2012/0194276 | A1 | | 8/2012 | Fisher |

FOREIGN PATENT DOCUMENTS

EP             3133735 A1    2/2017

OTHER PUBLICATIONS

U.S. Appl. No. 14/919,511, Zhu et al., filed Oct. 21, 2015.
(Continued)

*Primary Examiner* — Hieu Nguyen
(74) *Attorney, Agent, or Firm* — Sherry W. Schumm (57) ABSTRACT

A multiple-stage RF amplifier and a packaged amplifier device include driver and final-stage transistors, each having a control terminal, a first current-carrying terminal, and a second current-carrying terminal. The control terminal of the final-stage transistor is electrically coupled to the first current-carrying terminal of the driver transistor. The amplifier further includes an inter-stage circuit coupled between the first current carrying terminal of the driver transistor and a voltage reference node. The inter-stage circuit includes a first inductance, a first capacitor, and a second capacitor. The first inductance and the first capacitor are coupled in series between the first current carrying terminal and the voltage reference node, with an intermediate node between the first inductance and the first capacitor. The second capacitor has a first terminal electrically coupled to the intermediate node and a second terminal electrically coupled to the voltage reference node.

9 Claims, 8 Drawing Sheets

(56) References Cited

OTHER PUBLICATIONS

Brinkhoff, J. et al. "Effect of Baseband Impedance on FET Intermodulation", IEEE Transatcions on Microwave Theory and Techniques, vol. 51, No. 3, pp. 1045-1051 (Mar. 2003).
Gallou, N. et al. "Analysis of Low Frequency Memory and Influence on Solid State HPA Intermodulation Characteristics", IEEE MTT-S Digest, pp. 979-982 (May 2001).
Hill, D. "High-Voltage HBT Technology", IEEE Gallium Arsenide Integrated Circuit Symposium Technical Digest, pp. 149-152 (Nov. 1998).
Rubio, J. et al. "3-3.6-GHz Wideband GaN Doherty Power Amplifier Exploiting Output Compensation Stages", IEEE Transactions on Microwave Theory and Techniques, vol. 60, No. 8, pp. 2543-2548 (Aug. 2012).
Sun, G. et al. "Broadband Doherty Power Amplifier via Real Frequency Technique", IEEE Transactions on Microwave Theory and Techniques, vol. 60, No. 1, pp. 99-111 (Jan. 2012).

* cited by examiner

MULTIPLE-STAGE RF AMPLIFIER DEVICES

TECHNICAL FIELD

Embodiments of the subject matter described herein relate generally to packaged semiconductor devices, and more particularly to packaged, radio frequency (RF) amplifier devices.

BACKGROUND

Emerging wireless networks have evolved to support and provide high spectral efficiency modulation techniques such as quadrature modulation (QAM) combined with orthogonal frequency division multiplexing (OFDM). These modulated communication signals include high peak-to-average power ratio (PAPR) signals. In addition, next generation wireless standards such as long-term evolution advanced (LTE-A) support a wide frequency spectrum allocation and carrier aggregation (CA) techniques to further extend the signal bandwidth. Therefore, operating at higher data rates with wideband signals in a high power amplifier (PA) requires highly linear and efficient signal transmission.

To transmit successful amplification of intra-band interband CA signals in contiguous or non-contiguous modes, high linearity requirements warrant increasing the instantaneous bandwidth (IBW) of the PA. Furthermore, when wideband OFDM signals in concurrent mode are transmitted through a high power PA, severe electrical memory effects and inter-modulation distortion (IMD) may result. These distortions present limitations to digital predistortion (DPD) linearization.

In fifth generation (5G) systems, transmitters require spectrum efficiency enhancement using massive multiple-input multiple-output (MIMO) techniques and need a large number of PAs. In addition, 5G DPD systems require high linearization capacity and implementation complexity to optimize the efficiency-linearity of a PA. To reduce power consumption and size of DPD systems, low-complexity DPD solutions are desirable. Accordingly, it is also desirable to design high efficiency PAs with minimal distortions.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The Doherty power amplifier (DPA) is one of the most popular solutions for amplifying high peak to average power ratio (PAPR) signals. Several bandwidth extending techniques for DPAs have been introduced. However, such DPAs have exhibited narrow bandwidth digital predistortion (DPD) performance due to the restriction of instantaneous bandwidth (IBW) characteristics. To extend IBW, some designers have investigated nonlinearity of PAs and reduced memory effects. The baseband impedance may be a predominant factor for reducing memory effects by carefully designing matching and biasing circuits.

Embodiments of the inventive subject matter include highly linear, fully integrated, high power (e.g., 40 watt (W)), multiple-stage PAs and DPAs (e.g., for 4/5G communication systems). To extend IBW, the PA and DPA embodiments include linearity enhancement circuitry to minimize low frequency second-order terms. By using a DPD technique, DPA embodiments have been shown to achieve −58 decibels relative to the carrier (dBc) adjacent channel leakage ratio (ACLR) with 42 percent total line-up efficiency at 39 decibels per milliwatt (dBm) average output power with a 365 megahertz (MHz) IBW at a center frequency of 2 gigahertz (GHz). Embodiments of two-stage RFIC PAs for extending IBW and improving nonlinearity are described below. In addition, the measured RF performance also is discussed, and DPD linearization is discussed using DPA embodiments to validate enhanced IBW.

In previous third-order intermodulation (IM3) analyses, the drain current is described by a Taylor series as in Equation 1:

$$i_d = G_m v_g + G_d v_d + G_{m2} v_g^2 + G_{md} v_g v_d + \\ G_{d2} v_d^2 + G_{m3} v_g^3 + G_{m2} v_g^2 v_d + G_{md2} v_g v_d^2 + G_{d3} v_d^3 \quad (1)$$

where $v_g$ and $v_d$ are the gate and drain signal voltages, and $G_m$ and $G_d$ are the first-order transconductance and drain conductance respectively.

Assuming a non-linear response of a non-linear system under two-tone excitation, the in-band IM3 terms could generate the envelope signal, which is second-order intermodulation (IM2) terms, mixed with the fundamental signal calculated in Equation 2:

$$V_{d3} = V_s^3 Z_0(\omega_c)(c_0 Z_0(\Delta\omega) + c_1 + c_2 Z_0(2\omega_c)) \quad (2)$$

where $Z_0$ is frequency-dependent load impedance, $\omega_c$ and $\Delta\omega$ are the carrier frequency and two-tone spacing, Vs is the magnitude of each tone in the two-tone signal, and c0, c1 and c2 are defined as:

$$c_0 = \frac{1}{2}\left(G_{m2} + \frac{1}{2}G_{md}(A + A^*) + G_{d2}AA^*\right) \times (G_{md} + 2G_{d2}A)$$

$$c_1 = -\frac{3}{4}\left(G_{m3} + \frac{1}{3}G_{m2d}(2A + A^*) + \frac{1}{3}G_{md2}(2AA^* + A^2) + G_{d3}A^2A^*\right)$$

$$c_2 = \frac{1}{4}(G_{m2} + G_{md}A + G_{d2}A^2) \times (G_{md} + 2G_{d2}A^*)$$

where A is the linear gain at the fundamental frequency $\omega c$, r is a pole due to the gate-source capacitance, and * denotes a complex conjugate corresponding to negative frequency.

This IM3 distortion is strongly related to the memory effect. Furthermore, when two-tone signal spacing becomes wider, it has a crucial impact on the linearity performance of a PA.

The memory effect is caused by the envelope, fundamental, or second harmonic voltages. In a two-stage PA, high magnitude and phase variation of impedance at the internal drain of the first and second stage transistor can cause varying envelope voltage at different modulation frequencies. This may result in significant distortions in the PA. According to an embodiment, high baseband impedance may be reduced by including proper load terminations in order to reduce the memory effect.

Figure 1:
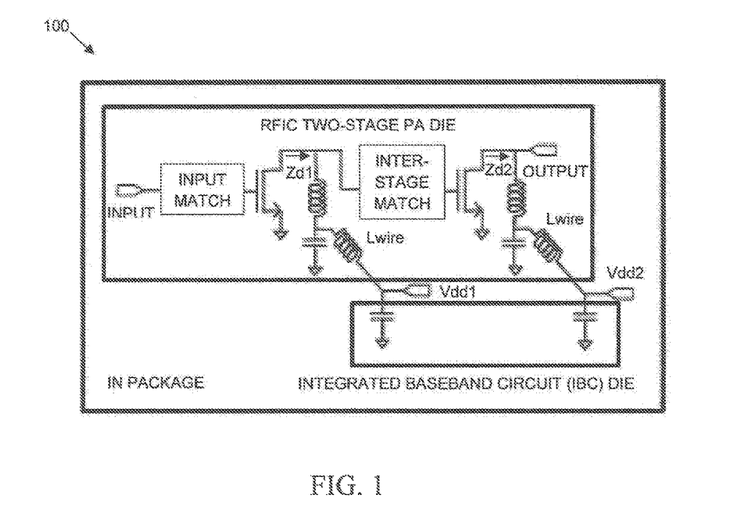
FIG. 1 is a schematic diagram of an embodiment of a two-stage power amplifier (PA) with an integrated baseband circuit.

FIG. 1 shows a schematic diagram of an embodiment of a two-stage RFIC PA 100 (radio frequency integrated circuit power amplifier). In an active die area, the input matching of the driver transistor, and the inter-stage matching network between the driver and the final stage transistors are integrated on the same die, in an embodiment. A new matching topology with an integrated baseband circuit (IBC) is included, according to an embodiment, which may reduce or minimize the drain baseband impedances of the driver and final stage transistors.

Figure 2A:
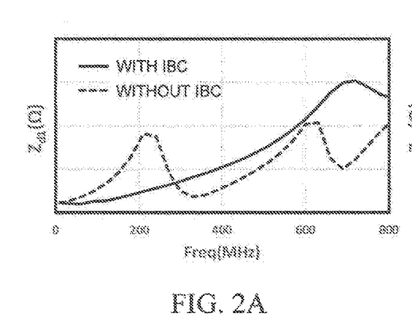
FIGS. 2A and 2B illustrate simulation results showing internal drain impedances for a two-stage PA embodiment at a first stage and at a second stage, respectively.
Figure 2B:
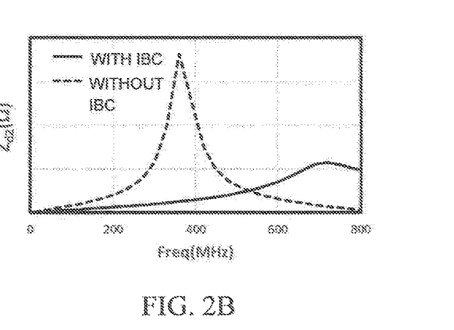

An embodiment of a matching topology includes shunt inductance (L) and capacitance (C) to potentially provide optimal load impedance at an operational frequency. The shunt capacitor(s) in the active die are implemented using metal-insulator-metal (MIM) capacitors, in an embodiment, which provide capacitance values on the order of a few picofarads (pF). To further reduce the baseband impedance, an embodiment of the IBC is implemented using bonding wires and relatively large capacitors in separate die(s). FIG. 2 depicts simulation results showing internal drain impedances for a two-stage PA embodiment at a first stage (FIG. 2A) and at a second stage (FIG. 2B), respectively. As indicated, the inclusion of high density capacitors on the order of several nanofarad (nF) in an embodiment of an IBC may provide significant reduction of the baseband impedance and phase variation over a wide frequency range of more than 700 megahertz (MHz). Therefore, implementation of an embodiment of a baseband termination in a PA may improve IM3 distortion and extend IBW without degradation in RF performance.

Figure 3:
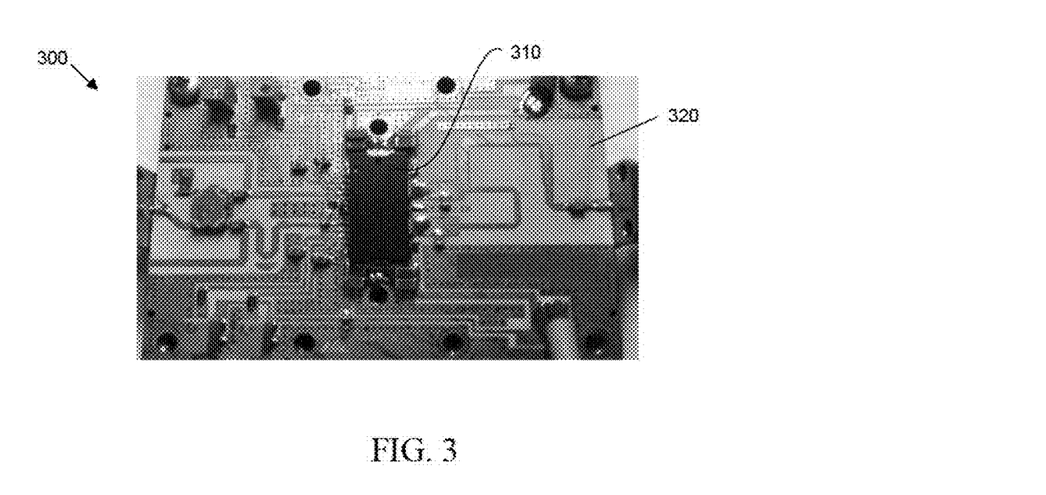
FIG. 3 is a depiction of a symmetrical Doherty PA, according to an embodiment.

FIG. 3 illustrates an embodiment of a 40 W symmetrical DPA 800, which includes a laterally-diffused metal oxide semiconductor LDMOS device 310 in a package that is encapsulated by over-mold plastic. The device 310 is mounted to a printed circuit board (PCB) 320 with 30 mil thickness.

Figure 4:
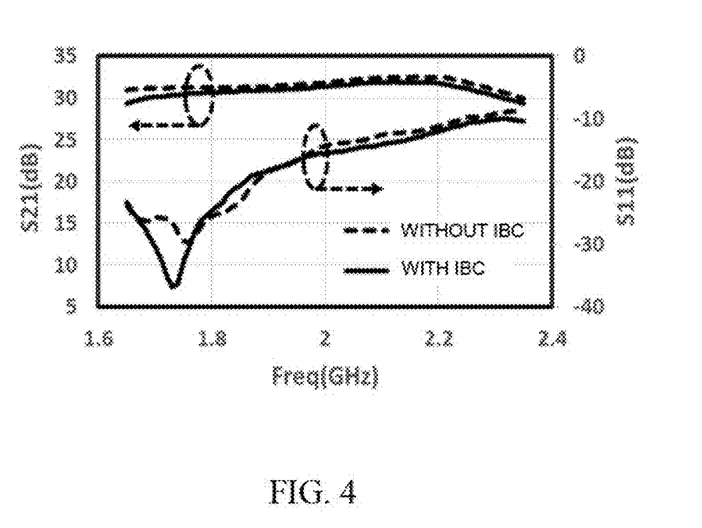
FIG. 4 illustrates a graph of measured S-parameters for an embodiment of a symmetrical Doherty PA.

FIG. 4 illustrates the small-signal RF performance for the device 310 of FIG. 3 when operated with a 28 volt (V) drain voltage. The DPA performance with an embodiment of an IBC may demonstrate extremely broadband gain with above 30 decibel (dB) power gain from 1.7 GHz to 2.3 GHz, when compared with the DPA performance without an embodiment of an IBC. The input return loss is more than 10 dB over the frequency range.

Figure 5:
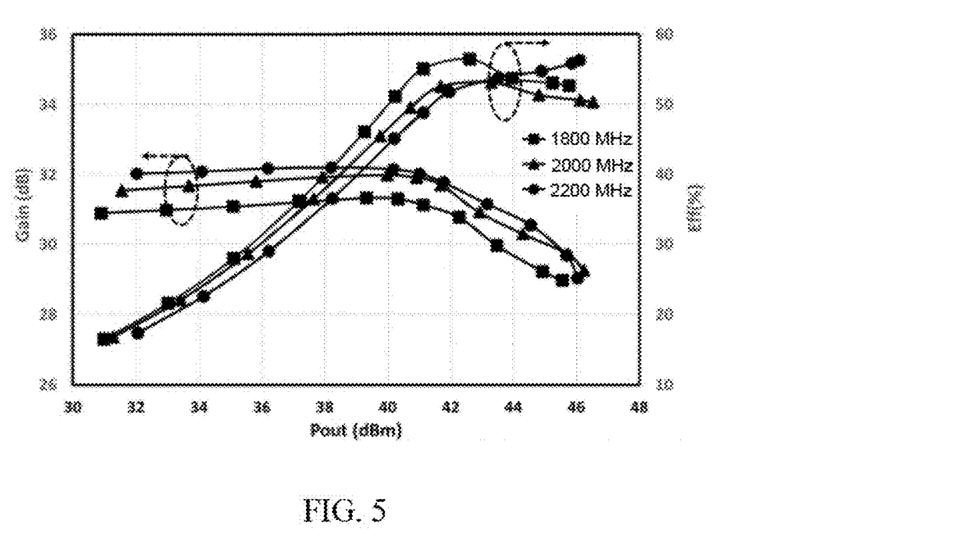
FIG. 5 illustrates a graph of measured gain and efficiency versus output power for an embodiment of a Doherty PA with an integrated baseband circuit under a continuous wave signal.

FIG. 5 shows efficiency and gain versus output power for an embodiment of a DPA with an IBC from 1.8 GHz to 2.2 GHz with a continuous wave (CW) signal. Above 31 dB power gain at 10 dB backed-off power level from P3 dB output power, P3 dB output power higher than 46.5 dBm and total line-up drain efficiency from 50 percent to 56 percent at P3 dB output power and from 45 percent to 51 percent at 6 dB back-off are achieved over the frequency range.

Figure 6:
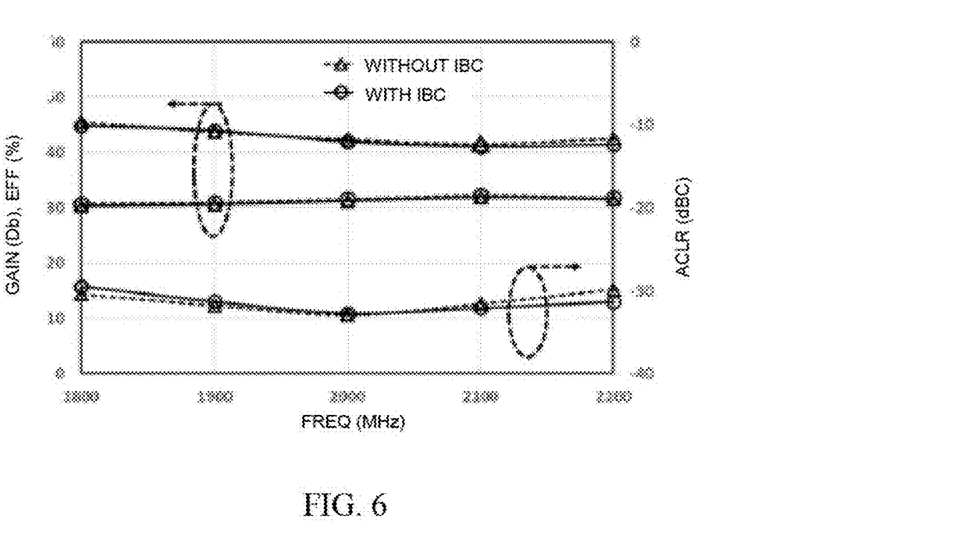
FIG. 6 includes a graph of measured power gain, overall drain efficiency, and adjacent channel leakage ratio of a conventional Doherty PA and an embodiment of a Doherty PA with an integrated baseband circuit.

FIG. 6 shows the measured gain, efficiency, the adjacent channel leakage ratio (ACLR) and power gain for an embodiment of a DPA with an IBC at an average output power of 39.3 dBm, which is approximately 8 dB backed-off power level from the saturated output power using a single carrier wideband code division multiple access (WCDMA) signal with 5 MHz bandwidth and 9.9 peak-to-average-power-ratio (PAPR). The measured performance of an embodiment of a DPA with an IBC demonstrates between 41 percent and 45 percent total line-up efficiency, above 30 dB power gain and ACLR better than −30 dBc from 1.8 GHz to 2.2 GHz, when compared with the performance of a DPA without the IBC.

The measured linearization performances of an embodiment of a DPA at 8 dB back-off output power are summarized in Table I:

TABLE I

| DPD LINEARIZATION RESULTS. | | | | | |
|---|---|---|---|---|---|
| | Pout (dBm) | Efficiency | Lower Band ACLR (dBc) | Upper Band ALCR (dBc) | DPD |
| 2C LTE | 39.1 | 42.1% | −30.3 | −31.4 | OFF |
| | | | −55.7 | −58.1 | ON |
| 8C LTE | 39.3 | 43.5% | −28.5 | −26.9 | OFF |
| | | | −50.1 | −50.4 | ON |

Figure 7A:
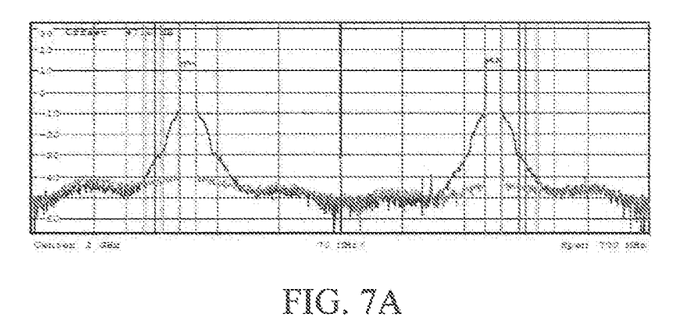
FIGS. 7A and 7B include graphs of measured power spectral densities of an embodiment of a Doherty PA under 2C long term evolution (LTE) signals and 8C LTE signals, respectively, before linearization and after linearization.
Figure 7B:
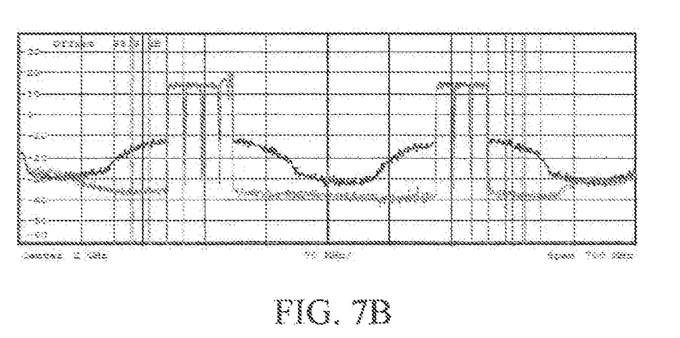

FIG. 7 shows the measured spectrum before and after linearization. The wideband signals consisting of 20 MHz 2-carrier LTE signals in FIG. 7A and 20 MHz 6-carrier LTE signal, 10 MHz 1-carrier LTE signal, and 5 MHz 1-carrier LTE signal in FIG. 7B with a PAPR of 7.3 dB and total 365 MHz IBW was utilized for excitation. The ACLRs lower than −50.1 dBc can be achieved using a DPD system for dual band applications. The DPA embodiment exhibits excellent linear amplification of 365 MHz wideband modulated signals through lower memory effects. Compared with a conventional DPA, an LDMOS 2-stage DPA embodiment may be capable of delivering higher linearity with a 365 MHz signal and at a high level of efficiency.

An embodiment of a 40 W 2-stage RFIC DPA demonstrates highly linear performance with extra wide IBW amplifying widely spaced modulated signals. The integrated baseband impedance circuit may reduce memory effects and improve linearity. The DPA embodiment may achieve total line-up efficiency of 43.5 percent at output power of 39.3 dBm while restricting ACLR to below −50.1 dBc over 365 MHz IBW. Compared with conventional DPAs, this may be the highest linearization performance for extra wide IBW signals. Furthermore, an embodiment of a DPA may be an attractive PA topology for low complexity 5G DPD systems.

Figure 8:
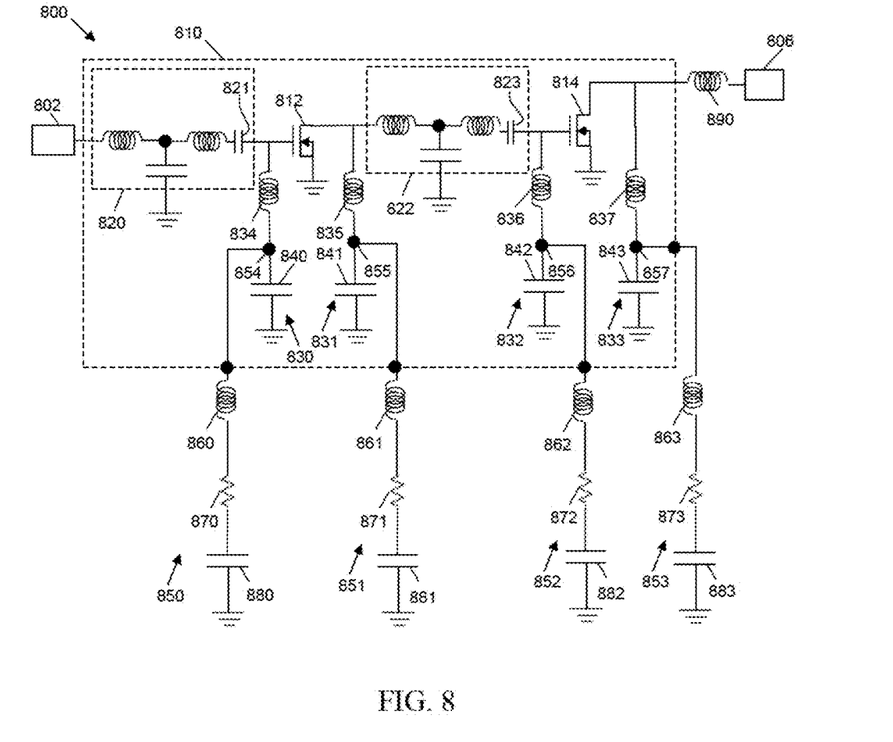
FIG. 8 is a schematic diagram of an RF amplifier device, in accordance with an embodiment.

Various embodiments of PAs, DPAs, and physical implementations of PA devices that include integrated baseband circuits (IBC) will now be described in conjunction with FIGS. 8-10. More specifically, FIG. 8 is a schematic diagram of an RF power amplifier device 800 with a plurality of IBCs, in accordance with an embodiment. Device 800 includes an input lead 802, an input impedance matching circuit 820 ("input matching circuit"), a driver transistor 812, an inter-stage impedance matching circuit 822 ("inter-stage matching circuit"), a final-stage transistor 814, a plurality of IBCs (including high-pass shunt circuits 830-833 and envelope frequency termination circuits 850-853), and an output lead 806, in an embodiment. Essentially, device 800 forms portions of an amplifier, which is configured to increase the power of an RF signal input to the device 800. Together, the series-coupled driver transistor 812 and final-stage transistor 814 provide a two-stage amplifier, which is configured to amplify RF signals at and near a fundamental operating frequency, $f_o$.

Although not shown in FIG. 8, device 800 also may include bias circuitry to provide bias voltages to the gates of one or both of transistors 812, 814 and/or to the drain of transistor 812. When such bias circuitry is implemented, series decoupling capacitors (e.g., capacitors 821, 823) also may be included in the device 800. In addition, device 800 also may include an output impedance matching circuit electrically coupled between final-stage transistor 814 and the output lead 806, in an alternate embodiment. For example, such an output circuit may be configured to match the output impedance of device 800 with the input impedance of an external circuit or component (not shown) that may be coupled to output lead 806. More specifically, such an output circuit may provide a portion of an impedance match between the transistor 806 and a load (not illustrated) to which the device 800 is coupled. Accordingly, such an output circuit may be considered to be an output impedance matching circuit (or an output impedance "pre-match" circuit, where a remainder of the impedance matching is performed at the PCB level).

Input lead 802 and output lead 806 each include a conductor, which is configured to enable the device 800 to be electrically coupled with external circuitry (not shown). More specifically, input and output leads 802, 806 are physically located between the exterior and the interior of the device's package.

According to an embodiment, transistors 812, 814 are the primary active components of device 800, and transistors 812, 814 are integrated onto a single semiconductor die, as indicated by dashed box 810. Driver transistor 812 is configured to pre-amplify an input RF signal received through input lead 802 (i.e., to apply a relatively low gain to the input RF signal), and final-stage transistor 814 is configured to further amplify the pre-amplified RF signal produced by the driver transistor 812 (i.e., to apply a relatively high gain to the pre-amplified RF signal). Driver transistor 812 includes a control terminal and two current conducting terminals, where the current conducting terminals are spatially and electrically separated by a variable-conductivity channel. Similarly, final-stage transistor 814 also includes a control terminal and two current conducting terminals. For example, transistors 812, 814 may be field effect transistors (FET) (such as metal oxide semiconductor FETs (MOSFETs) or high electron mobility transistors (HEMTs)), each of which includes a gate (control terminal), a drain (a first current conducting terminal), and a source (a second current conducting terminal). Alternatively, transistors 812, 814 may be bipolar junction transistors (BJTs). Accordingly, references herein to a "gate," "drain," and "source," are not intended to be limiting, as each of these designations has analogous features for a BJT implementation (e.g., a base, collector, and emitter, respectively).

According to an embodiment, and using nomenclature typically applied to MOSFETs in a non-limiting manner, the gate of driver transistor 812 is coupled to the input lead 802 through input matching circuit 820, the drain of driver transistor 812 is coupled to the gate of final-stage transistor 814 through inter-stage matching circuit 822, and the source of driver transistor 812 is coupled to ground (or another voltage reference). The drain of final-stage transistor 814 is coupled to the output lead 806 through inductance 890 (and/or an output matching circuit, not illustrated), and the source of final-stage transistor 814 is coupled to ground (or another voltage reference). Through the variation of control signals (e.g., input RF signals) provided to the gate of driver transistor 812, the current between the current conducting terminals of transistor 812 may be modulated. Similarly, through the variation of control signals (e.g., pre-amplified RF signals from driver transistor 812) provided to the gate of final-stage transistor 814, the current between the current conducting terminals of transistor 814 may be modulated.

Input matching circuit 820 is configured to raise the impedance of device 800 to a higher (e.g., intermediate or higher) impedance level (e.g., in a range from about 2 to about 10 Ohms or higher). Input matching circuit 820 is coupled between the input lead 802 and the control terminal (e.g., gate) of the driver transistor 812. According to an embodiment, input matching circuit 820 includes two series inductive elements (e.g., two sets of bondwires) and a shunt capacitor, as shown. A first inductive element (e.g., a first set of bondwires) is coupled between input lead 802 and a first terminal of the shunt capacitor, and a second inductive element (e.g., a second set of bondwires) is coupled between the first terminal of the shunt capacitor and the control terminal of transistor 812. The second terminal of the shunt capacitor is coupled to ground (or another voltage reference). The combination of the series inductive elements and the shunt capacitor functions as a low-pass filter. According to an embodiment, the series combination of the inductive elements may have a value in a range between about 50 picohenries (pH) to about 3 nanohenries (nH), and the shunt capacitor may have a value in a range between about 5 picofarads (pF) to about 80 pF. The inductances and capacitances may be lower or higher than the above-given ranges, as well. Further, other embodiments may include a differently configured input matching circuit 820.

Inter-stage matching circuit 822 is configured to match the output impedance (or drain impedance) of transistor 812 with the input impedance of transistor 814. Inter-stage matching circuit 822 is coupled between the first current conducting terminal (e.g., drain) of transistor 812 and the control terminal (e.g., gate) of transistor 814. According to an embodiment, inter-stage matching circuit 822 is similarly configured to input matching circuit 820, with two series inductive elements (e.g., two sets of bondwires) and a shunt capacitor. The inductance and capacitance values of the inductors and shunt capacitance may fall within the ranges of the corresponding components of input impedance matching circuit 820, although they may be lower or higher, as well. Further, other embodiments may include a differently configured inter-stage matching circuit 822.

The drain of final stage transistor 814 is coupled to the output lead 806 through an additional inductive element 890, and the source of final-stage transistor 814 is coupled to ground (or another voltage reference).

As mentioned above, device 800 also includes one or more integrated baseband circuits (IBCs) in the form of high-pass shunt circuits 830-833, and envelope frequency termination circuits 850-853, in an embodiment. As shown in FIG. 8, an IBC can be coupled to any of a number of nodes along the path between the input and output leads 802, 806. For example, a first IBC (including circuits 830, 850) is coupled at the input between the gate of driver transistor 812 and ground (or another voltage reference). A second IBC (including circuits 831, 851) is coupled in the inter-stage region between the drain of driver transistor 812 and ground (or another voltage reference). A third IBC (including circuits 832, 852) is coupled in the inter-stage region between the gate of final-stage transistor 814 and ground (or another voltage reference). Finally, a fourth IBC (including circuits 833, 853) is coupled at the output between the drain of final-stage transistor 814 and ground (or another voltage reference). Although device 800 shows four IBCs, other device embodiments may include more or fewer IBCs and/or IBCs coupled to other nodes between the input and output leads 802, 806. According to several embodiments, however, at least one IBC is coupled to at least one node in the inter-stage region (e.g., the second and/or third IBC mentioned above, including circuits 831, 851, and/or circuits 832, 852).

According to an embodiment, each IBC includes a high-pass shunt circuit 830-833, and an envelope frequency termination circuit 850-853. Each high-pass shunt circuit 830-833 may include a shunt L/C circuit (i.e., an inductor and capacitor coupled in series to ground), where the inductance and capacitance may be integrated onto the same die as the transistors 812, 814, in an embodiment (as indicated by dashed box 810). According to an embodiment, each high-pass shunt circuit 830-833 includes an inductive element 834, 835, 836, 837 coupled in series with a capacitor 840, 841, 842, 843 (e.g., a MIM capacitor). The first terminals of the inductive elements 834-837 are coupled to the gate of the driver transistor 812, the drain of the driver transistor 812, the gate of the final-stage transistor 814, and the drain of the final-stage transistor 814, respectively. The second terminals of the inductive elements 834-837 each are coupled to a first terminal of one of the capacitors 840-843, with an intermediate node 854, 855, 856, 857 between the elements. The second terminals of each of the capacitors 840-843 each are coupled to ground (or another voltage reference). According to an embodiment each shunt inductor 834-837 may have a value in a range between about 100 pH to about 5 nH, and each shunt capacitor 840-843 may have a value in a range between about 10 pF to about 200 pF, although these components may have values outside of these ranges, as well.

The values of inductors 834-837 and capacitors 840-843 may be selected so that an RF "cold point" may be present at the node 854-857 between each shunt inductor 834-837 and shunt capacitor 840-843, where an RF cold point represents a high impedance point in the circuit at the center frequency of operation. According to an embodiment, an envelope frequency termination circuit 850, 851, 852, 853 is coupled between each RF cold point (or each node 854-857) and ground (or another voltage reference), and each envelope frequency termination circuit 850-853 is configured to provide a termination for the envelope frequencies of device 800. In an embodiment, each node 854-857 may include a conductive pad (e.g., a bondwire pad) exposed at a surface of the integrated circuit within which the transistors 812, 814 and shunt circuits 830-833 are integrated.

According to an embodiment, each envelope frequency termination circuit 850-853 includes an envelope inductance 860, 861, 862, 863, an envelope resistor 870, 871, 872, 873, and an envelope capacitor 880, 881, 882, 883 coupled in series. In other embodiments, envelope resistors 870-873 may be excluded, and each envelope frequency termination circuit 850-853 instead may include an envelope inductance 860-863 directly coupled to an envelope capacitor 880-883.

For example, each envelope inductance 860-863 may be implemented as a set of bondwires coupling a node 854-857 (e.g., a bondwire pad) to an envelope resistor 870-873 (or to an envelope capacitor 880-883 when envelope resistors 870-873 are excluded). In such embodiments, the inductance value of each envelope inductance 860-863 may be in a range between about 400 pH to about 1.5 nH, although the inductance may be smaller or larger, as well.

According to an embodiment, each envelope capacitor 880-883 (and each envelope resistor 870-873, when included) is implemented separately from the die in which the transistors 812, 814 are implemented. In other words, the envelope capacitors 880-883 are not integrated within the transistor die, but instead are implemented on separate die(s) (e.g., as one or more integrated passive devices (IPDs)), or as discrete components, as indicated by capacitors 880-883 being located outside of dashed box 810. For example, and as will be explained in more detail below, embodiments of RF amplifier devices include discrete capacitors 880-883 (e.g., high value chip capacitors, MOS capacitors, and so on), discrete or integrated resistors 870-873, and/or IPD assemblies to implement the envelope capacitors 880-883 and envelope resistors 870-873. In various embodiments, each envelope resistor 870-873 may have a value in a range between about 0.1 Ohm to about 2 Ohm, and each envelope capacitor 880-883 may have a value in a range between about 1 nanofarad (nF) to about 40 nF (or even as large as 1 microfarad (µF)), although these components may have values outside of these ranges, as well.

Although transistors 812, 813 and various elements of the device circuits 820, 822, 830-833, 850-853 are shown as singular components, the depiction is for the purpose of ease of illustration and explanation only. Those of skill in the art would understand, based on the description herein, that transistors 820, 822 and/or certain elements of the various device circuits 820, 822, 830-833, 850-853 each may be implemented as multiple components (e.g., connected in parallel or in series with each other). In addition, although FIG. 8 illustrates an embodiment of a single-path device (e.g., including a single input lead, output lead, amplification path, etc.), other embodiments include dual-path devices (e.g., including two input leads, output leads, amplification paths, etc., as shown in FIGS. 9, 10), and/or multi-path devices (e.g., including two or more input leads, output leads, amplification paths, etc.). Further, the number of input/output leads may not be the same as the number of amplification paths (e.g., there may be multiple amplifiers operating in parallel for a given set of input/output leads). The description of transistors 812, 813 and various elements of the device circuits 820, 822, 830-833, 850-853, below, thus are not intended to limit the scope of the inventive subject matter only to the illustrated embodiments.

The embodiments illustrated and described herein correspond to a two-stage amplifier, in which a driver transistor and a final-stage transistor are used to amplify an input RF signal. Embodiments of the inventive subject matter also may be applied in multiple-stage (e.g., three-stage and higher-order) amplifiers, as well. Although multiple-stage amplifiers are not discussed in detail herein, embodiments of multiple-stage amplifiers are included within the scope of the inventive subject matter.

Embodiments of the amplifier device 800 of FIG. 8 may be included as portions of a variety of types of amplifiers. For example, one or more instantiations of an embodiment of device 800 may be implemented in a Doherty power amplifier (DPA), or in another type of amplifier. FIG. 9 is a simplified schematic diagram of a DPA 900 in accordance with an embodiment. More specifically, DPA 900 includes multiple amplifier paths 904, 906, where at least one of the amplifier paths includes an embodiment of an IBC 960-963, 970-973 coupled to one or more nodes in an inter-stage portion of the amplifier, and also potentially to other nodes at the input and/or output sides of the amplifier. Although a two-way DPA 900 is illustrated in FIG. 9 and described in detail herein, those of skill in the art would understand, based on the description herein, that embodiments of the inventive subject matter could be applied to amplifiers having more than two parallel amplification paths (e.g., a Doherty amplifier with a carrier amplifier path and more than one peaking amplifier paths).

DPA 900 includes an input node 901, an output node 903, an RF amplifier device 902, a power divider 970, and a power combiner 980, according to an embodiment. Essentially, an RF input signal received at input node 901 is amplified by DPA 900 and provided to a load 905 (e.g., an antenna) via output node 903. As will be described in more detail below, the DPA 900 is configured in a Doherty amplifier topology. Accordingly, the RF amplifier device 902 includes multiple amplifier paths, which include a carrier path 904 and one or more peaking paths 906, respectively.

Power divider 970 is coupled between input node 901 and input terminals 940, 942 to the RF amplifier device 902. Power divider 970 is configured to divide the input power of an input signal received at node 901 into multiple portions of the input signal, where respective portions of the input signal are provided to input terminals 940, 942. For example, a first output of the power divider 970 may be coupled to the input terminal 940 corresponding to the carrier path 904, and a second output of the power divider 970 may be coupled to the input terminal 942 corresponding to the peaking path 906. The power divider 970 may divide the input power equally among the amplifier paths 904, 906, such that roughly half of the input signal power is provided to each path 904, 906. Alternatively, the power divider 970 may divide the power unequally.

RF amplifier device 902 is a discretely packaged electrical component, which is coupled to a PCB that includes components of the DPA 900 that are not contained within RF amplifier device 902. Accordingly, input and output terminals 940, 942, 950, 952 of RF amplifier device 902 represent the interface between the device 902 and amplifier components that are external to device 902. That interface is more commonly referred to as the "package plane" of the DPA 900.

Within device 902, the carrier and peaking paths 904, 906 each includes an input impedance matching circuit (INPUT MATCH) 910, 912, a driver amplifier stage 920, 922, an inter-stage impedance matching circuit (INTER-STAGE MATCH) 930, 932, and a final amplifier stage 921, 923 coupled in series between input terminals 940, 942 and output terminals 950, 952. In addition, one or more IBC 960-963, 970-973 may be coupled along either or both of the carrier and peaking paths 904, 906. In a particular embodiment, at least one IBC (e.g., IBCs 960, 962 and/or IBCs 971, 972) is coupled to a node between the driver and final-stage amplifiers 920, 921 and/or 922, 923. The IBC(s) 960-963, 970-973 may be configured as described previously in conjunction with FIG. 8.

One, some, or all of the impedance matching circuits 910, 912, 930, 932 may be realized as a low-pass impedance matching circuit (e.g., a shunt capacitance impedance matching circuit topology). In alternate embodiments, one, some, or all of the impedance matching circuits 910, 912, 930, 932 may be realized as a high-pass impedance matching circuit.

Given that DPA 900 is a Doherty amplifier, amplifier stage 921 is biased to operate in class AB mode, and amplifier stage 923 is biased to operate in class C mode. More specifically the transistor arrangement of carrier amplifier stage 921 is biased to provide a conduction angle between 980 and 360 degrees. Conversely, the transistor arrangement of the peaking amplifier stage 923 is biased to provide a conduction angle less than 980 degrees. According to various embodiments, the amplifier stages 920, 921, and 922, 923 may be asymmetrical (i.e., of different sizes) or symmetrical (i.e., substantially the same sizes).

In the illustrated embodiments, the multiple amplifier paths 904, 906 are contained within a single device package in which the input and output terminals 940, 942, 950, 952 provide external electronic connectivity to the device 902. More specifically, the input and output terminals 940, 942, 950, 952 generally represent the package leads, pins, or other physical interfaces for providing electrical connections to the internal components (e.g., amplifier paths 904, 906) of the RF amplifier device 902. Referring to later-described embodiments, for example, input terminals 940, 942 may correspond to input leads 1002 (FIG. 10), and output terminals 950, 952 may correspond to output leads 1006 (FIG. 10). In an alternate embodiment, the multiple amplifier paths 904, 906 may be contained in separate and distinct device packages.

Power combiner 980 is coupled between output terminals 950, 952 of the RF amplifier device 902 and output node 903. Power combiner 980 includes two inputs, a summing node 988, and an output that is coupled to the amplifier output 903. The output terminals 950, 952 each are coupled to an input to the power combiner 980, and thus to the summing node 988, which reactively combines amplified signals received from the amplifier paths 904, 906.

Power divider 970, RF amplifier device 902, and power combiner 980 are designed so that the total phase shifts applied along the amplifier paths 904, 906 ensure that the currents ultimately provided to summing node 988 by the respective amplifier paths 904, 906 are received substantially in-phase with each other. Accordingly, the current provided by summing node 988 to output node 903 (and to load 905) represents the in-phase summation of the currents provided by amplifier paths 904, 906.

Figure 9:
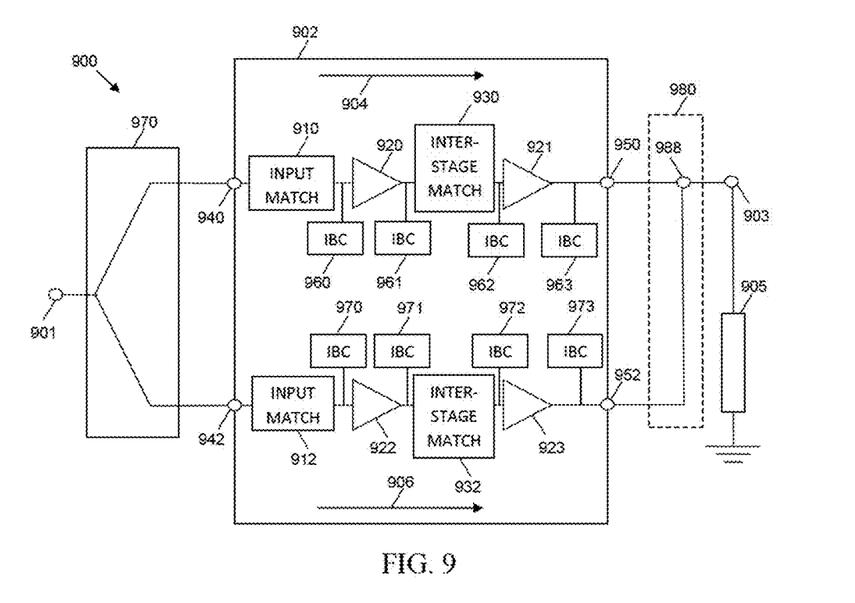
FIG. 9 is a simplified schematic diagram of a Doherty PA, in accordance with an embodiment.

It should be understood that FIG. 9 is a simplified representation of a DPA 900 for purposes of explanation and ease of description, and that practical embodiments may include other devices and components to provide additional functions and features, and/or the DPA 900 may be part of a much larger electrical system, as will be understood. Thus, although FIG. 9 depicts direct electrical connections between circuit elements and/or terminals, alternative embodiments may employ intervening circuit elements and/or components while functioning in a substantially similar manner.

Figure 10:
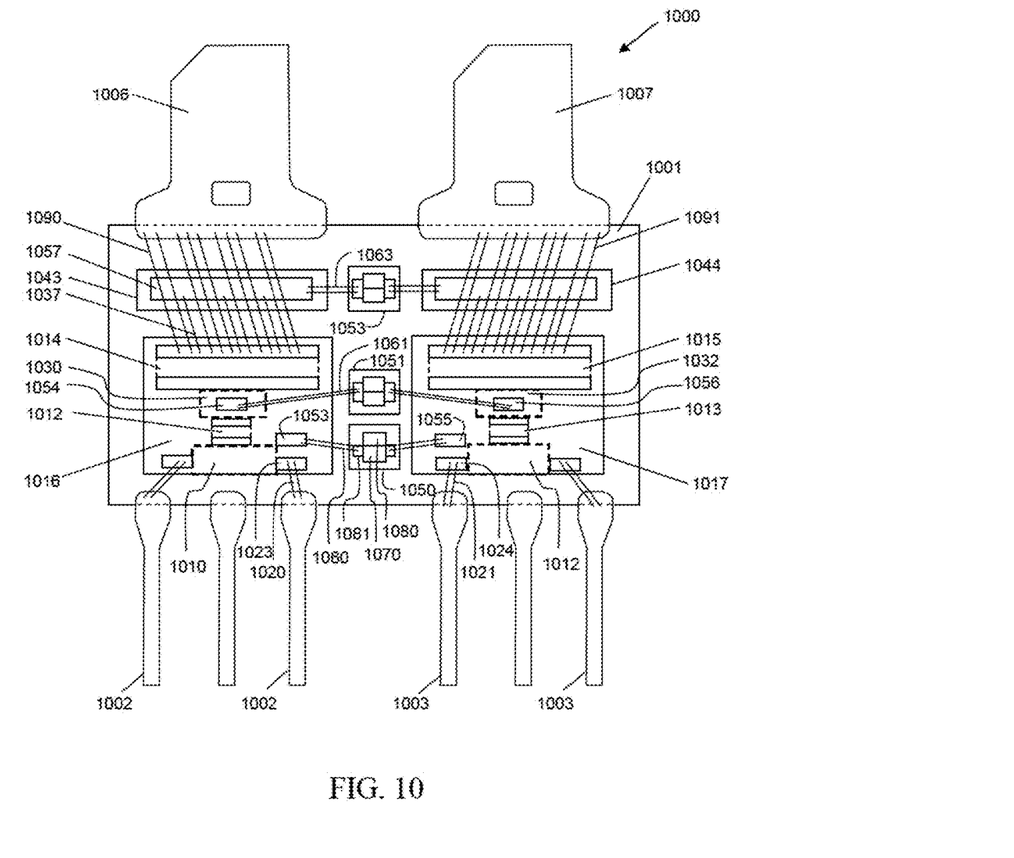
FIG. 10 is a top view of an example of a packaged RF amplifier device that embodies the circuit of FIG. 8, in accordance with an example embodiment.

FIG. 10 is a top view of an example of a packaged RF amplifier device 1000 that embodies portions of the circuits of FIGS. 1, 8, and 9, in accordance with an example embodiment. More particularly, the interconnected electrical components and elements of device 1000 may be modeled, in part, by the schematic diagrams of FIGS. 1, 8, and 9. The device 1000 of FIG. 10 includes two parallel amplification paths between input and output leads 1002, 1003, 1006, 1007 (e.g., one instance of the circuitry of FIG. 1 or 8 between leads 1002 and 1006, and another instance of the circuitry of FIG. 1 or 8 between leads 1003 and 1007). Accordingly, the device 1000 of FIG. 10 may form a portion of a DPA (e.g., DPA 900, FIG. 9) or another multi-path amplifier. More specifically, transistor die 1016 may correspond to a carrier amplifier, and transistor die 1017 may correspond to a peaking amplifier, in an embodiment.

Device 1000 includes a flange 1001, input leads 1002, 1003 (e.g., corresponding to two instances of input lead 802 or to inputs 940, 942, FIGS. 8, 9), output leads 1006, 1007 (e.g., corresponding to two instances of output lead 806 or to outputs 950, 952, FIGS. 8, 9), an isolation structure (not shown), a plurality of transistor or amplifier dies 1016, 1017 (e.g., two instances of die 810, FIG. 8), and a plurality of IBCs (as will be described in more detail below), all of which may be packaged together as parts of the device 1000. In the example of FIG. 10, device 1000 includes two transistor die 1016, 1017 that essentially function in parallel, although another semiconductor device may include one transistor die or more than two transistor dies, as well.

According to an embodiment, device 1000 may be incorporated in an air cavity package, in which transistor dies 1016, 1017, IBCs, and various other circuit elements are located within an enclosed air cavity. Basically, the air cavity is bounded by flange 1001, an isolation structure (not shown) attached to the top surface of flange 1001, and a cap (not shown) overlying and in contact with the isolation structure and leads 1002, 1003, 1006, 1007. In other embodiments, a device may be incorporated into an overmolded package (i.e., a package in which the electrical components within the active device area are encapsulated with a non-conductive molding compound, and in which portions of the leads 1002, 1003, 1006, 1007 also may be encompassed by the molding compound).

Flange 1001 includes a rigid electrically-conductive substrate, which has a thickness that is sufficient to provide structural support for electrical components and elements of device 1000. In addition, flange 1001 may function as a heat sink for transistor dies 1016, 1017 and other devices mounted on flange 1001. Flange 1001 has a top and bottom surface (only the top surface is visible in FIG. 10), and a substantially-rectangular perimeter that corresponds to the perimeter of the device 1000.

Flange 1001 is formed from a conductive material, and may be used to provide a ground reference for the device 1000. For example, various components and elements may have terminals that are electrically coupled to flange 1001, and flange 1001 may be electrically coupled to a system ground when the device 1000 is incorporated into a larger electrical system. At least the surface of flange 1001 is formed from a layer of conductive material, and possibly all of flange 1001 is formed from bulk conductive material. Alternatively, flange 1001 may have one or more layers of non-conductive material below its top surface. Either way, flange 1001 has a conductive top surface. Flange 1001 may more generally be referred to as a substrate with a conductive surface.

In an air-cavity package embodiment, an isolation structure (not shown) is attached to the top surface of flange 1001. The isolation structure is formed from a rigid, electrically insulating material (i.e., a material with a dielectric constant in a range from about 3.0 to about 30.0, although materials with higher or lower dielectric constants may be used), and has a top surface and an opposed bottom surface. The term "isolation structure," as used herein, refers to a structure that provides electrical isolation between conductive features of a device (e.g., between leads 1002, 1003, 1006, 1007 and flange 1001). For example, isolation structure may be formed from inorganic materials (e.g., ceramic such as aluminum oxide, aluminum nitride, and so on) and/or organic materials (e.g., one or more polymers or printed circuit board (PCB) materials).

The bottom surface of the isolation structure is attached to the top surface of flange 1001, as indicated above, and the leads (e.g., leads 1002, 1003, 1006, 1007) may be coupled to the top surface of the isolation structure 1008 using epoxy (or other adhesive materials), solder, brazing, sintering, or other attachment means.

The isolation structure has a frame shape, in an embodiment, which includes a substantially enclosed, four-sided structure with a central opening through which the top surface of the flange 1001 is exposed. The isolation structure may have a substantially rectangular shape, or the isolation structure may have another shape (e.g., annular ring, oval, and so on). The isolation structure may be formed as a single, integral structure, or the isolation structure may be formed as a combination of multiple members.

The input and output leads 1002, 1003, 1006, 1007 are mounted on a top surface of the isolation structure on opposed sides of the central opening, and thus the input and output leads 1002, 1003, 1006, 1007 are elevated above the top surface of the flange 1001, and are electrically isolated from the flange 1001. For example, the input and output leads 1002, 1003, 1006, 1007 may be soldered or otherwise attached to metallization on a top surface of the isolation structure. Generally, the input and output leads 1002, 1003, 1006, 1007 are oriented in order to allow for attachment of bondwires (e.g., bondwires 1020, 1021, 1090, 1091) between the input and output leads 1002, 1003, 1006, 1007 and components and elements within the central opening of the isolation structure.

Transistor die 1016, 1017, various elements of the IBCs (e.g., IPDs 1050, 1051, 1053 that include capacitors (e.g., capacitor 1080) and resistors (e.g., resistor 1070)), and other components (e.g., output IPDs 1043, 1044) are mounted on a generally central portion of the top surface of a flange 1001 that is exposed through the opening in isolation structure 1008. As used herein, an "active device area" corresponds to a portion of a device on which one or more active devices (e.g., transistor die 1016, 1017), IPDs 1050-1053, 1043, 1044, and/or other electrical components are mounted (e.g., the portion of the conductive surface of flange 1001 that is exposed through the opening in isolation structure). For example, the transistor die 1016, 1017 and IPDs 1050-1053, 1043, 1044 may be coupled to flange 1001 using conductive epoxy, solder, solder bumps, sintering, and/or eutectic bonds.

The transistor die 1016, 1017 may be implemented using various types of semiconductor substrates, such as silicon, silicon-on-insulator (SOI), silicon-on-sapphire (SOS), gallium arsenide (GaAs), gallium nitride (GaN), GaN on silicon carbide, GaN on silicon, or other types of substrate materials. Further, each of the transistors within the transistor die 1016, 1017 may be a FET (such as a metal oxide semiconductor FET (MOSFET), a laterally diffused MOSFET (LD-MOS FET), a high electron mobility transistor (HEMT), and so on), which includes a gate (control terminal), a source (a first current conducting terminal), and a drain (a second current conducting terminal). Alternatively, each of the transistors may be a BJT.

Each transistor die 1016, 1017 includes at least two serially-connected transistors 1012-1014, each of which has a control terminal (e.g., a gate) and two current conducting terminals (e.g., a drain and a source). In the embodiment depicted in FIG. 10, for example, each transistor die 1016, 1017 includes a driver transistor 1012, 1013 (e.g., transistors 920, 922, FIG. 9) and a final-stage transistor 1014, 1015 (e.g., transistors 921, 923, FIG. 9). Alternatively, a transistor die may have more than two serially-connected transistors. In addition, each transistor die 1016, 1017 may include an integrated input match circuit 1010, 1012 (e.g., circuits 910, 912, FIG. 9) and an inter-stage match circuit 1030, 1032 (e.g., circuits 930, 932, FIG. 9). As will be explained in more detail below, each transistor die 1016, 1017 also includes conductive pads 1053, 1054, 1055, 1056 (corresponding to nodes 854, 855, FIG. 8) exposed at the top surface of each die 1016, 1017 that are configured for attachment of bondwires 1060, 1061 (corresponding to inductances 860, 861, FIG. 8).

On the input side, the gate of each driver transistor 1012, 1013 is electrically coupled through an input match circuit 1010, 1012, a conductive pad (not numbered), and bondwires 1020, 1021 to input leads 1002, 1003. Within each transistor die 1012, 1013, the input match circuit 1010, 1012 is electrically coupled to the gate of the driver transistor 1012, 1013, and the drain of the driver transistor 1012, 1013 is electrically coupled through the inter-stage match circuit 1030, 1032 to the gate of the final-stage transistor 1014, 1015.

On the output side, the drain of the final-stage transistor 1014, 1015 is electrically coupled to an output lead 1006, 1007 through bondwires 1090, 1091 (e.g., inductive element 890, FIG. 8). The other current conducting terminal (e.g., the source) of each transistor 1012, 1013, 1014, 1015 is electrically coupled to the flange 1001 (e.g., to ground), in an embodiment. For example, the source of each transistor 1012, 1013, 1014, 1015 may be electrically coupled to the flange 1001 through the semiconductor substrate of each transistor die 1016, 1017.

According to an embodiment, a plurality of IBCs (e.g., IBCs 960, 961, 963, 970, 971, 973, FIG. 9) are electrically coupled along each amplification path. More specifically, along a first path (e.g., a carrier amplifier path), a first IBC (e.g., IBC 960) is coupled to the input match circuit 1010 between input pad 1023 and the gate of driver transistor 1012. The first IBC includes a shunt circuit (e.g., shunt circuit 830, FIG. 8) which is integrated within the die 1016, and an envelope frequency termination circuit (e.g., circuit 850, FIG. 8). Contact pad 1053 corresponds to a node (e.g., node 854, FIG. 8) between an integrated shunt inductor (e.g., inductor 834, FIG. 8) and an integrated shunt capacitor (e.g., capacitor 840, FIG. 8). The envelope frequency termination circuit includes an inductance (e.g., inductance 860, FIG. 8) in the form of bondwires 1060 that are connected between contact pad 1053 on the transistor die 1016 and contact pad 1081 on IPD 1050. IPD 1050 includes an envelope resistor 1070 (e.g., resistor 870, FIG. 8) and an envelope capacitor 1080 (e.g., capacitor 880, FIG. 8) coupled in series between contact pad 1081 and a ground reference node (e.g., at the bottom of IPD 1050). In an alternate embodiment, resistor 1070 may be excluded, and envelope capacitor 1080 may be directly coupled between contact pad 1081 and the ground reference node. In an embodiment, capacitor 1080 may be implemented in the form of a relatively large value (e.g., high density) chip capacitor, or another type of discrete capacitor with a sufficiently high capacitance value.

Also along the first path, a second IBC (e.g., IBC 961 or 962, FIG. 9) is coupled to the inter-stage match circuit 1030 between the drain of driver transistor 1012 and the gate of final-stage transistor 1014. The second IBC includes a shunt circuit (e.g., shunt circuit 831 or 832, FIG. 8) which is integrated within the die 1016, and an envelope frequency termination circuit (e.g., circuit 851 or 852, FIG. 8). Contact pad 1054 corresponds to a node (e.g., node 855 or 856, FIG. 8) between an integrated shunt inductor (e.g., inductor 835 or 836, FIG. 8) and an integrated shunt capacitor (e.g., capacitor 841 or 842, FIG. 8). The envelope frequency termination circuit includes an inductance (e.g., inductance 861 or 862, FIG. 8) in the form of bondwires 1061 that are connected between contact pad 1054 on the transistor die 1016 and a contact pad (not numbered) on IPD 1051. IPD 1051 includes an envelope resistor (not numbered) (e.g., resistor 871 or 872, FIG. 8) and an envelope capacitor (not numbered) (e.g., capacitor 881 or 882, FIG. 8) coupled in series between the IPD contact pad and a ground reference node (e.g., at the bottom of IPD 1051). In an alternate embodiment, the resistor may be excluded, and envelope capacitor may be directly coupled between the IPD contact pad and the ground reference node. As with IPD 1050, the capacitor of IPD 1051 may be implemented in the form of a relatively large value (e.g., high density) chip capacitor, or another type of discrete capacitor with a sufficiently high capacitance value.

Even further along the first path, a third IBC (e.g., IBC 963, FIG. 9) is coupled between the drain of final-stage transistor 1014 and ground (or another voltage reference). The third IBC includes a shunt circuit (e.g., shunt circuit 833, FIG. 8) and an envelope frequency termination circuit (e.g., circuit 853, FIG. 8). Unlike the previously-discussed shunt circuits, the shunt circuit included within the third IBC is not integrated within the die 1016. Instead, the shunt circuit is implemented using an inductance (e.g., inductance 837, FIG. 8) in the form of bondwires 1037 that are electrically connected between the drain of final-stage transistor 1014 and a contact pad 1057 at the top surface of IPD 1043. IPD 1043 includes a shunt capacitor (e.g., capacitor 843, FIG. 8) with a first terminal coupled to contact pad 1057, and a second terminal coupled to ground (e.g., to flange 1001). In addition, contact pad 1057 corresponds to a node (e.g., node 857, FIG. 8) between the bondwires 1037 (e.g., inductor 837, FIG. 8) and the shunt capacitor within IPD 1043 (e.g., capacitor 843, FIG. 8). The envelope frequency termination circuit includes an inductance (e.g., inductance 863, FIG. 8) in the form of bondwires 1063 that are connected between contact pad 1057 on the IPD 1043 and a contact pad (not numbered) on IPD 1053. IPD 1053 includes an envelope resistor (not numbered) (e.g., resistor 873, FIG. 8) and an envelope capacitor (not numbered) (e.g., capacitor 883, FIG. 8) coupled in series between the IPD contact pad and a ground reference node (e.g., at the bottom of IPD 1053). In an alternate embodiment, the resistor may be excluded, and envelope capacitor may be directly coupled between the IPD contact pad and the ground reference node. As with IPDs 1050 and 1051, the capacitor of IPD 1053 may be implemented in the form of a relatively large value (e.g., high density) chip capacitor, or another type of discrete capacitor with a sufficiently high capacitance value.

Similarly configured IBCs (e.g., IBCs 970-973, FIG. 9) also may be electrically coupled along the second path (e.g., the peaking amplifier path). As shown in FIG. 10, the IBCs coupled along the second path may utilize the same IPDs 1050-1053 as the IBCs coupled along the first path, including utilizing some of the same components in the envelope frequency termination circuits.

In the above described embodiments, shunt circuits include both capacitors integrated within a transistor die (e.g., capacitors 840-843, FIG. 8) and high-value discrete capacitors that are separate from the transistor die (e.g., capacitors 880-883, FIG. 8). Part of the motivation for including both types of capacitors lies with the current technological difficulty with integrating high-value capacitors into transistor die. The above-described embodiments may be modified to integrate a single high-value capacitor into the transistor die as technologies advance (e.g., using trench capacitor or other technologies), thus reducing the shunt circuits to a shunt inductance (e.g., inductances 834-837, FIG. 8) in series with a single, integrated shunt capacitance (e.g., capacitors 840-843, but with values approaching the values stated for capacitors 880-883, FIG. 8).

Figure 11:
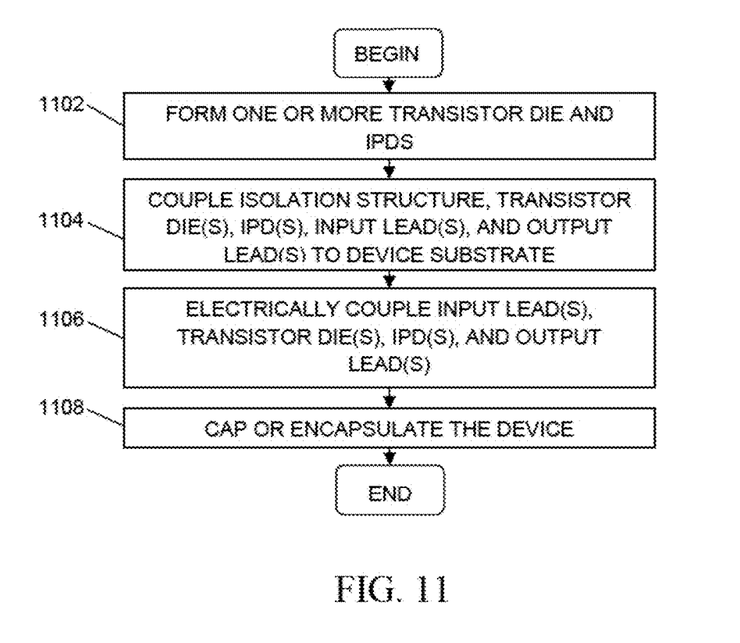
FIG. 11 is a flowchart of a method of manufacturing a packaged RF device, in accordance with an example embodiment.

FIG. 11 is a flowchart of a method of manufacturing a packaged RF device (e.g., device 1000, FIG. 10), in accordance with an example embodiment. The method may begin, in block 1102, by forming various components of the device, including forming one or more transistor die (e.g., die 1016, 1017, FIG. 10) and forming one or more IPDs (e.g., IPDs 1043, 1044, 1050, 1051, 1053, FIG. 10). In various embodiments, the IPDs include high value shunt capacitors that form portions of IBCs (e.g., corresponding to capacitors 880-883, FIG. 8).

In block 1104, for an air cavity embodiment, an isolation structure is coupled to a device substrate (e.g., flange 1001, FIG. 10). In addition, the transistor die (e.g., die 1016, 1017, FIG. 10) and IPD(s) (e.g., IPDs 1043, 1044, 1050, 1051, 1053, FIG. 10) are coupled to a portion of the top surface of the substrate that is exposed through an opening in the isolation structure (e.g., the active device area). Leads (e.g., input and output leads 1002, 1003, 1006, 1007, FIG. 10) are coupled to the top surface of the isolation structure (e.g., to metallization on the top surface of the isolation structure). For overmolded (e.g., encapsulated) device embodiments, the isolation structure may be excluded, and the substrate and leads may form portions of a leadframe.

In block 1106, the input lead(s), transistor die(s), IPD(s), and output lead(s) are electrically coupled together. As discussed in detail previously, the electrical connections may be made using bondwires between the various device components and elements. Finally, in block 1108, the device is capped (for an air-cavity embodiment) or encapsulated (e.g., with mold compound for an overmolded embodiment). The device may then be incorporated into a larger electrical system.

An embodiment of a multiple-stage RF amplifier includes a first transistor having a first control terminal, a first current-carrying terminal, and a second current-carrying terminal, and a second transistor having a second control terminal, a third current-carrying terminal, and a fourth current-carrying terminal, where the second control terminal is electrically coupled to the first current-carrying terminal of the first transistor. The amplifier further includes an inter-stage circuit coupled between the first current carrying terminal and a voltage reference node. The inter-stage circuit includes a first inductance, a first capacitor, and a second capacitor. The first inductance and the first capacitor are coupled in series between the first current carrying terminal and the voltage reference node, with an intermediate node between the first inductance and the first capacitor. The second capacitor has a first terminal electrically coupled to the intermediate node and a second terminal electrically coupled to the voltage reference node.

An embodiment of a packaged amplifier device includes a package substrate with a top surface, an input lead coupled to the package substrate, a first transistor coupled to the top surface of the package substrate, and a second transistor coupled to the top surface of the package substrate. The first transistor has a first control terminal, a first current-carrying terminal, and a second current-carrying terminal, and the first control terminal is coupled to the input lead. The second transistor has a second control terminal, a third current-carrying terminal, and a fourth current-carrying terminal, and the second control terminal is electrically coupled to the first current-carrying terminal of the first transistor. The packaged amplifier device further includes an inter-stage circuit coupled between the first current carrying terminal and a voltage reference node. The inter-stage circuit includes a first inductance, a first capacitor, and a second capacitor. The first inductance and the first capacitor are coupled in series between the first current carrying terminal and the voltage reference node, with an intermediate node between the first inductance and the first capacitor. The second capacitor has a first terminal electrically coupled to the intermediate node and a second terminal electrically coupled to the voltage reference node.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-stage radio frequency (RF) amplifier comprising:
    a substrate;
    a semiconductor die coupled to a top surface of the substrate, wherein the semiconductor die includes a contact pad exposed at a top surface of the semiconductor die;
    a first discrete device that is separate from the semiconductor die, wherein the first discrete device is coupled to the top surface of the substrate;
    a first transistor monolithically formed in the semiconductor die, the first transistor having a first control terminal, a first current conducting terminal, and a second current conducting terminal;
    a second transistor monolithically formed in the semiconductor die, the second transistor having a second control terminal, a third current conducting terminal, and a fourth current conducting terminal, wherein the second control terminal is electrically coupled to the first current conducting terminal of the first transistor; and
    an inter-stage circuit coupled between the first current conducting terminal and a voltage reference node, wherein the inter-stage circuit includes a first inductance, a second inductance, a first capacitor, and a second capacitor, wherein the first inductance and the first capacitor are coupled in series between the first current carrying terminal and the voltage reference node, the contact pad corresponds to an intermediate node between the first inductance and the first capacitor, the second capacitor forms a portion of the first discrete device, the second inductor includes one or more bondwires connected between the contact pad and a first terminal of the second capacitor, a second terminal of the second capacitor is electrically coupled to the voltage reference node, the second capacitor has a capacitance value of at least 1 nanofarad, and the one or more bondwires and the second capacitor are configured to reduce a baseband impedance at the first current conducting terminal of the first transistor.

2. The amplifier of claim 1, further comprising:
    a shunt circuit coupled between the third current conducting terminal and the voltage reference node, wherein the shunt circuit includes a third inductance and a third capacitor coupled in series, with a second intermediate node between the third inductance and the third capacitor; and
    a baseband circuit that includes a fourth capacitor with a first terminal electrically coupled to the second intermediate node, and a second terminal electrically coupled to the voltage reference node.

3. The amplifier of claim 2, wherein
the fourth capacitor forms a portion of a second discrete device that is separate from the semiconductor die and the first discrete device.

4. The amplifier of claim 2, wherein
the second and third capacitors form portions of the first discrete device.

5. The amplifier of claim 2, further comprising:
    a fourth inductance with a first terminal coupled to the second intermediate node and a second terminal coupled to the first terminal of the fourth capacitor.

6. The amplifier of claim 5, wherein:
the fourth inductance comprises one or more second bondwires.

7. The amplifier of claim 1, wherein:
the first capacitor has a capacitance value in a range from 1 picofarad to 20 picofarads; and
the second capacitor has a capacitance value in a range from 1 nanofarad to 20 nanofarad.

8. The amplifier of claim 1, wherein:
the first capacitor is a metal-insulator-metal capacitor integrally formed with the semiconductor die; and
the second capacitor comprises a metal oxide semiconductor capacitor.

9. The amplifier of claim 1, further comprising:
an inter-stage matching network coupled between the first current conducting terminal and the second control terminal.

* * * * *